United States Patent [19]
Denes et al.

[11] Patent Number: 6,082,292
[45] Date of Patent: Jul. 4, 2000

[54] SEALING ROLLER SYSTEM FOR SURFACE TREATMENT GAS REACTORS

[75] Inventors: Ferencz S. Denes; Majid Sarmadi, both of Madison; Robert J. Sandberg, Verona, all of Wis.

[73] Assignee: Wisconsin Alumni Research Foundation, Madison, Wis.

[21] Appl. No.: 09/225,748

[22] Filed: Jan. 5, 1999

[51] Int. Cl.$^7$ .................................................. C23C 16/00
[52] U.S. Cl. ...................... 118/718; 156/345; 118/723 E; 118/729
[58] Field of Search .................................. 118/718, 729, 118/728, 730, 723 E; 156/345

[56] References Cited

U.S. PATENT DOCUMENTS

| | | | |
|---|---|---|---|
| 5,000,114 | 3/1991 | Tanagi et al. ............................. | 118/733 |
| 5,114,770 | 5/1992 | Echizen et al. . | |
| 5,130,170 | 7/1992 | Kanai et al. . | |
| 5,224,441 | 7/1993 | Felts ........................................ | 118/718 |
| 5,300,189 | 4/1994 | Kokaku et al. ........................... | 156/643 |
| 5,314,539 | 5/1994 | Brown et al. . | |
| 5,397,395 | 3/1995 | Sano et al. . | |
| 5,458,856 | 10/1995 | Marie et al. . | |
| 5,523,124 | 6/1996 | Slootman et al. . | |
| 5,527,629 | 6/1996 | Gastiger et al. . | |
| 5,576,076 | 11/1996 | Slootman et al. . | |
| 5,652,029 | 7/1997 | Itoh ........................................ | 427/569 |

FOREIGN PATENT DOCUMENTS 622474  11/1994  European Pat. Off. .

OTHER PUBLICATIONS

K.W. Gerstenberg, "A reactor for plasma polymerization on polymer films", Materials Science and Engineering, A139, pp. 110–119, 1991.

J.C. Rostaing, et al., "Silicon–based, protective transparent multilayer coatings deposited at high rate on optical polymers by dual–mode MW/r.f. PECVD", Thin Film Solids, 236, pp. 58–63, 1993.

J.C. Rostaing, et al., "Highly homogeneous silica coatings for optical and protective applications deposited by PECVD at room temperature in a planar uniform distributed electron cyclotron resonance plasma reactor", Thin Film Solids 270, pp. 49–54, 1995.

E. Prinz, et al., Aldyne—A new high–quality, stable surface treatment for plastic films, paper, and metal foils, Flexo & Gravure International, pp. 64–66, Mar. 1996.

RK Print–Coat Instruments Ltd., Rotary Koater product information.

S.D. Lee, et al., "Surface Modification of Polymeric Films under Reactive–Gas Corona–Discharge Conditions", overhead slides presented Jun. 1997.

*Primary Examiner*—Thi Dang
*Assistant Examiner*—Luz L. Alejandro
*Attorney, Agent, or Firm*—Foley & Lardner

[57] ABSTRACT

A surface treatment gas reactor features a reactor housing and a roller assembly for transporting a bi-dimensional material into and out of a gas reaction chamber. The reactor housing has a reactive gas inlet port and gas outlet or vacuum ports formed therein. Electrodes are mounted within the reactor housing between the gas inlet port and the gas outlet port such that a reactive gas admitted into the reaction chamber through the gas inlet port must pass through a plasma curtain generated by the electrodes before passing out of the outlet ports. The roller assembly includes a central roller having a grounded surface for transporting a bi-dimensional substrate through the reaction chamber on the surface thereof. The central roller is sized so as to reduce the active volume of the reaction chamber. Inside sealing rollers mounted adjacent to the central roller surface have compliant surfaces which form material transport contact points between the central roller and the inside sealing rollers. Outside sealing rollers having non-compliant surfaces are mounted adjacent to the inside sealing roller surfaces. Sealing blades mounted in the reactor housing create a low friction seal between the reactor housing and the outside sealing rollers in the roller assembly.

25 Claims, 2 Drawing Sheets

SEALING ROLLER SYSTEM FOR SURFACE TREATMENT GAS REACTORS

This invention was made with United States government support awarded by the following agencies: NSF Grant No.: EEC-8721545, USDA Hatch No.: 3550. The United States has certain rights in this invention.

FIELD OF THE INVENTION

The present invention pertains generally to methods and devices for surface treatment of bi-dimensional substrates using plasmas generated, for example, using corona discharge technology, and more particularly to methods and devices for transporting a continuous bi-dimensional substrate material through a gas reaction chamber while maintaining a seal between the chamber and the outside environment.

BACKGROUND OF THE INVENTION

The utility of natural and synthetic bi-dimensional substrates (i.e., web materials such as films, woven and non-woven fabrics, paper, etc.) can be enhanced by surface treatment of the substrate to tailor the substrate surface characteristics. For example, a bi-dimensional substrate may be coated to improve the barrier properties of the substrate material. The surface energy of a bi-dimensional substrate may be altered to improve wettability for improved printing, gluing, or coating of the substrate. The electrical polarity of a bi-dimensional substrate may be altered to improve the adhesivity of the material. The surface resistance of a substrate material may be altered to improve electrostatic properties. The coefficient of friction of a bi-dimensional substrate may be adjusted to improve or reduce slipping of the material. In general, surface treatment may be used to create high value added materials from more economical materials.

A conventional and traditional method for surface modification of bi-dimensional substrates is wet surface modification. By this method, a surface treatment material, such as a coating medium, in liquid form, is applied to the substrate surface. The liquid surface treatment material may be applied to the substrate surface by, for example, spraying or extruding the material onto the substrate surface or dipping the substrate into the treatment material.

Another, and more advanced, method for surface treatment of bi-dimensional substrates is plasma treatment. For plasma treatment, a substrate to be treated is placed in a reaction chamber along with a reactive gaseous material. The reaction chamber may be sealed, and the gas pressure level within the sealed reaction chamber set to a desired pressure level. Electrodes are positioned within the reaction chamber close to the substrate surface to be treated. A high voltage current signal (DC, AC, or high frequency (RF) depending upon the surface treatment material and process employed) is applied to the electrodes. The resulting electron discharge generates a plasma near the surface of the substrate being treated. A potential (such as ground potential) may be applied to or near the substrate material to draw the plasma into the material. Plasma treatment modifies the chemical nature of the surface layer of a substrate material, thereby affecting the surface properties of the material in the desired manner. Plasma treatment may be used to improve the bonding of coatings such as adhesives, dyes, inks, polymers and photographic emulsions to the bi-dimensional substrate, to improve the wettability of hydrophobic materials, or to alter mechanical properties, such as the coefficient of friction or the cohesiveness of textile fibers. In another variation, polymer films may be deposited on most surfaces by plasma polymerization from a discharge in an appropriate gaseous monomer. Apart from their potential use as bonding layers, such thin films find other possible uses, including protective and decorative layers, optical coatings, capacitor dielectrics and semi-permeable membranes.

Most of the research carried out in the field of surface treatment of organic and inorganic substrates under various plasma conditions is based on batch-type processing. Batch-type processing involves loading a substrate to be treated into a vacuum chamber, evacuating the vacuum chamber (typically while admitting a reactive gas from which the plasma will be generated into the vacuum chamber), processing to provide the desired surface treatment by generating a plasma, re-pressurizing the vacuum chamber, and unloading the finished treated substrate. This process must be repeated for each substrate to be treated. It is apparent that batch-type processing requires many steps, is costly, and cannot achieve high-productivity rates. Thus, plasma-based surface treatment by batch-type processing is not technologically or economically feasible for many industrial applications. This is especially true for the surface treatment of continuous filaments, webs, films, and the like. The treatment of such materials is only cost-affective if such substrates can be transported into a reaction chamber, through a plasma zone, and evacuated from the reaction chamber in a continuous manner without affecting the pressure level within the reaction chamber, allowing outside air into the reaction chamber, or allowing gaseous plasma components to escape from the reaction chamber. Various methods and systems have attempted to achieve a continuous flow of bi-dimensional substrate material to be treated through a sealed reaction chamber.

A basic approach for surface treating continuous uni-dimensional or bi-dimensional materials in a plasma chamber is to pass the material to be treated into and out of the chamber through a narrow hole or slot in the chamber. Such so-called slot seals are not very affective. Slot seal systems are characterized by high gas-leak rates into the reaction chamber through the slot seals. As a consequence, high pumping rates are required to maintain a desired pressure level within the chamber. Also, due to the open slot nature of the "slot sealing," significant environmental gas contamination dominates the treatment process.

Another sealing system which has been employed uses liquid seals. In such systems, the continuous bi-dimensional material to be treated is passed through a liquid barrier into and out of the treatment chamber. A liquid seal can provide a more effective seal between the interior of the treatment chamber and the outside environment than a slot seal. However, liquid sealing systems are not popular due to the contamination effects of the sealing liquids. Even if the solid material to be treated and the liquid sealing material are dissimilar, small liquid quantities retained on film and web surfaces through dispersion and capillary forces can induce undesired deposition effects under the discharge environment within the treatment chamber.

Belt sealing systems have also been employed to transport a continuous flow of bi-dimensional material to be treated into and out of a reaction chamber. However, such systems are complex and generally ineffective. Belt sealing systems do not provide sure vacuum sealing, and will not allow low pressure operations to be achieved.

The most promising approaches for sealing a vacuum reaction chamber while transporting a bi-dimensional substrate through a reaction zone within the chamber employ roller seals. Non-compliant and/or compliant rollers, depending on the nature of the substrate, are employed to transport the bi-dimensional substrate into and out of the reaction chamber. A seal is achieved between the roller surfaces and the surfaces of the bi-dimensional substrate at transport contact points between the rollers. Non-compliant rollers alone do not allow proper control of the pressure exerted by the rollers on the substrate. Compliant rollers alone create serious friction problems on roller-housing surfaces.

An exemplary known apparatus for plasma treatment of continuous bi-dimensional substrate material which employs a roller seal system is described in U.S. Pat. No. 5,314,539 to Robert W. Brown, et al. This patent describes a vacuum chamber for the treatment of materials of continuous length (e.g., films for photographic support) using a multiple roller system. In the system described, a single vacuum treatment chamber is divided into multiple sub-chambers. Roller systems separate the sub-chambers from each other, and transport the continuous material through the sub-chambers. For example, three rollers may be placed side-by-side across a vacuum chamber to divide the chamber into two sub-chambers. Outer side rollers in each three roller system have non-compliant surfaces, which are sealed to the vacuum chamber walls via face sealing elements composed of a rigid material resiliently biased into engagement with the outer side roller surfaces. A central roller in the three roller system has a compliant outer surface. A bi-dimensional material is transported from a first sub-chamber to a second sub-chamber between a first outer side roller and the central roller of the three roller system, and back out of the second sub-chamber into the first sub-chamber between the other outer side roller of the three roller system and the central roller. End sealing (sealing between the vacuum chamber walls and the roller end surfaces) is achieved using elongated end-sealing elements. These sealing elements extend across the rollers between the roller end surfaces and a chamber wall. This arrangement assures an uninterrupted sealing surface at the roller ends. The individual sub-chambers created by multiple roller systems positioned within a single vacuum chamber may be evacuated separately. By creating individual vacuum stages, a very low vacuum level can be achieved in at least one of the sub-chambers. Plasma treatment, under DC or RF conditions, can take place in this chamber. A separate backing roller is mounted within this chamber to supportingly carry the continuous material through the chamber. Alternatively, the central roller in the three roller system may be used to perform this function. A significant limitation of the multi-stage vacuum system described by Brown, et al., and of most other systems employing roller seals, is the complexity of the system and, specifically, the high number of roller seals employed to achieve effective sealing of the reaction chamber. Problems associated with the use of numerous rotating and stationary large sealing surfaces in roller sealing systems limits the ability to employ such systems in industrial settings.

SUMMARY OF THE INVENTION

The present invention provides a highly effective system for transporting a bi-dimensional substrate through a gas reaction chamber for the surface treatment thereof, while sealing the chamber from the outside environment. A gas reactor employing a sealing roller system in accordance with the present invention includes: a reactor housing defining an opening into a reaction chamber, a roller assembly attached to the reactor housing to close the opening into the reaction chamber defined by the reactor housing, and end walls or face plates mounted to the reactor housing and the roller assembly to close and seal the ends of the reaction chamber defined by the reactor housing and the roller assembly.

In accordance with the present invention, a sealing roller assembly employing five rollers is used to seal the opening into a reaction chamber defined by a reactor housing. The five rollers in a roller assembly in accordance with the present invention include: a grounded central roller, first and second inside sealing rollers mounted adjacent to the central roller to form transport contact points between each of the inside sealing rollers and the central roller, and first and second outside sealing rollers positioned adjacent to the first and second inside sealing rollers, respectively, between the inside sealing rollers and a wall of the reactor housing. The inside sealing rollers preferably have compliant roller surfaces, to allow non-slip control of a bi-dimensional substrate material transported into the reaction chamber through the transport contact points. The outside sealing rollers preferably have non-compliant roller surfaces. Long thin blades of hard sealing material, such as Teflon, are mounted in the reactor housing wall between the reactor housing wall and each outside sealing roller surface, to provide a seal between the reactor housing wall and the outside sealing roller surfaces. The outside sealing rollers thus provide a vacuum seal between both the inside sealing rollers and the outside sealing rollers and between the outside sealing rollers and the reactor housing. The preferably non-compliant surfaces of the outside sealing rollers ensure that sealing is achieved with minimum friction between the rotating outside sealing roller surfaces and the stationary blade seals mounted in the reactor housing. End sealing for the rollers in the roller assembly is provided by plates of sealing material, e.g., Teflon, positioned at each end of the sealing roller assembly and between which the rollers in the roller assembly are compressed.

The reactor housing preferably has a gas inlet port formed therein, through which a reactive gas may be admitted into the reaction chamber. One or more vacuum ports are also formed in the reactor housing. The reaction chamber may be evacuated via vacuum lines connected to the vacuum ports. Electrodes, for generating a plasma from the reactive gas admitted into the reaction chamber, are preferably mounted to the reactor housing within the reaction chamber. The roller assembly is preferably attached to the reactor housing such that the surface of the grounded central roller is positioned adjacent to the electrodes, such that a plasma may be generated between the electrodes and the grounded surface of the central roller. Preferably, the electrodes are positioned within the reaction chamber between the gas inlet port and the vacuum ports such that reactive gasses admitted into the reaction chamber via the gas inlet port are forced to pass through the plasma curtain generated by the electrodes before being evacuated from the reaction chamber through the vacuum ports.

Preferably, the size and shape of the reaction chamber defined by the reactor housing and the size of the grounded central roller are selected such that, when the roller assembly is mounted to the reactor housing, the central roller occupies most of the volume within the reaction chamber. Thus, the active volume of the reaction chamber is reduced, thereby reducing the volume of reactive gasses required to be handled during plasma treatment, and facilitating evacuation of plasma generated gas mixtures from the reaction chamber.

A bi-dimensional substrate material to be treated is transported into the reaction chamber at the transport contact point formed between the central roller and the first inside sealing roller, is transported on the surface of the central roller through the plasma curtain generated between the electrodes and the grounded central roller surface, and is transported back out of the reaction chamber at the transport contact point formed between the central roller and the second inside sealing roller. Rotation of the rollers in the roller assembly is controlled and synchronized in a conventional manner, using, e.g., a DC servo motor and appropriate gear connections. Synchronized rotation of all of the rollers in the roller assembly avoids undesirable tension buildup in the bi-dimensional substrate transported by the roller assembly, and eliminates slipping of the substrate on the roller surfaces. Transportation of the bi-dimensional substrate between the surface of the central roller and the preferably compliant surfaces of the inside sealing rollers allows proper control of the pressure exerted by the rollers on the substrate, preventing slipping and scratching of the substrate transported by the roller assembly, while providing a vacuum seal between the sealing rollers, substrate, and central roller.

A gas reactor employing a sealing roller system in accordance with the present invention has several advantages over previously known reactors employing roller sealing systems. A roller assembly in accordance with the present invention employs rollers having compliant and non-compliant surfaces, in combination, to assure vacuum tight sealing of the reaction chamber during the continuous passing of a bi-dimensional substrate through the chamber. The use of the outside sealing rollers, having non-compliant roller surfaces, in combination with a blade seal mounted in the reactor housing, permits vacuum tight sealing between the roller assembly and the reactor housing while avoiding excessive friction between non-rotating and rotating surfaces. Synchronized rotation of the rollers in the roller assembly avoids undesired tension buildup in the bi-dimensional substrate transported by the roller assembly into the reaction chamber, eliminating slipping of the substrate on the roller surfaces, thereby reducing scratching of the substrate being treated. The relative positioning of the gas inlet port and vacuum ports in the reactor housing assures that a reactive gas admitted into the reaction chamber will be forced to pass through a plasma curtain generated by electrodes positioned between the gas inlet and vacuum ports, before being evacuated from the chamber.

A gas reactor employing a sealing roller system in accordance with the present invention may be used for the plasma surface treatment of a variety of bi-dimensional substrate materials using a variety of reactive gasses in combination with various plasma generation technologies. Thus, a gas reactor in accordance with the present invention may be used for tailoring the surface characteristics of bi-dimensional natural and synthetic polymeric substrates to create high value added advanced materials from economic polymers. A gas reactor in accordance with the present invention may be used to generate specific surface functionalities on a bi-dimensional substrate or to deposit or to graft corona discharge synthesized layers on the surfaces of a macromolecular bi-dimensional substrate. For example, a gas reactor in accordance with the present invention may be used for the hydrophilization or hydrophobization of films and fabric, the creation of chemically inert surfaces by graft-deposition of Teflon-like structures, the generation of films or surfaces with tailored gas or liquid permeability characteristics, the development of new composites from surface adhesion improved dissimilar materials, and the creation of new composites from renewable natural polymeric substrates and thermoplastics, etc.

Further objects, features, and advantages of the present invention will be apparent from the following detailed description taken in conjunction with the accompanying drawings.

DETAILED DESCRIPTION OF THE INVENTION

Figure 1:
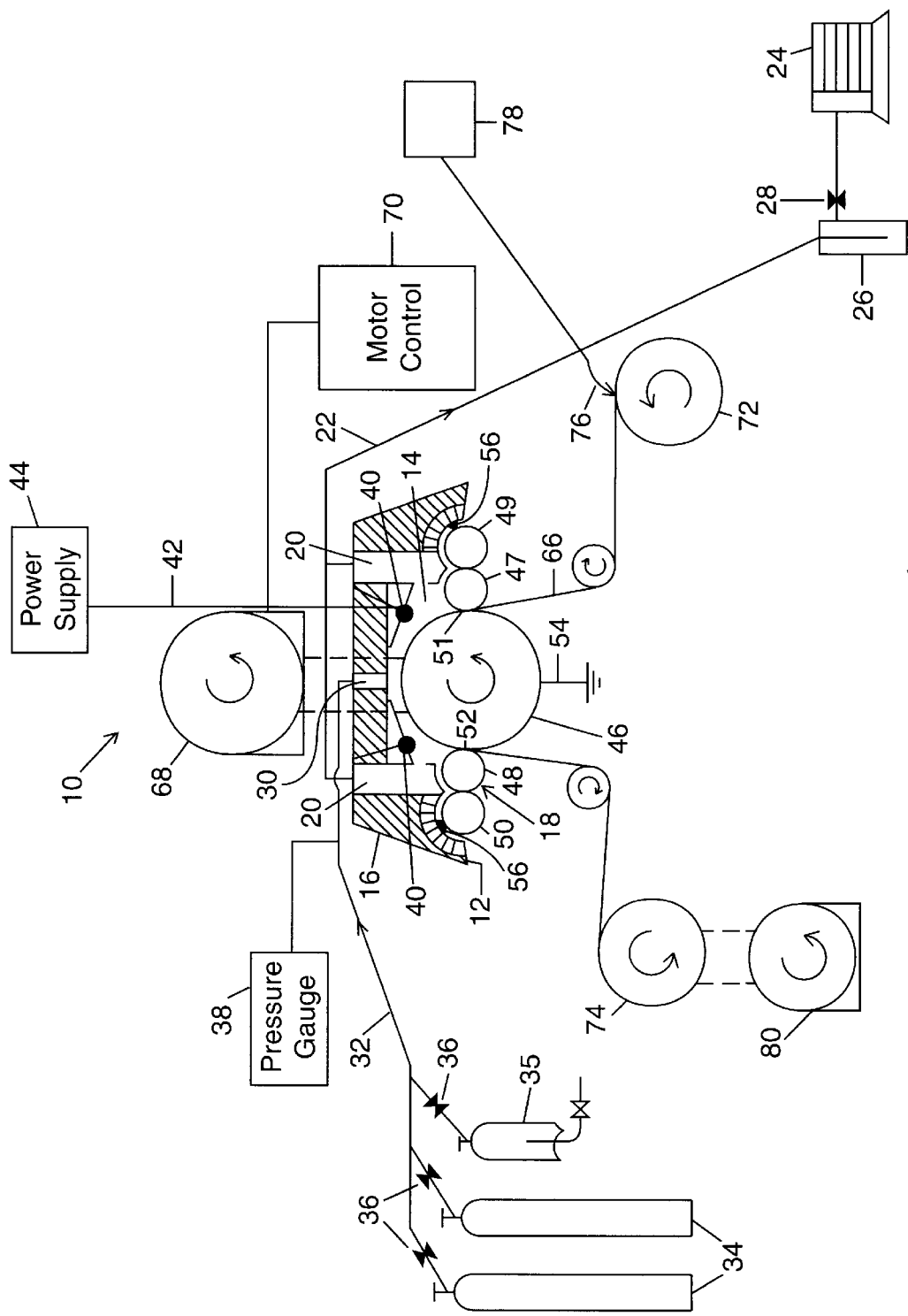
FIG. 1 is a schematic illustration of a system for the plasma surface treatment of a continuous bi-dimensional substrate material, including a schematic cross-sectional view of a gas reactor employing a sealing roller assembly in accordance with the present invention.

A system for the plasma surface treatment of a continuous bi-dimensional substrate in accordance with the present invention is illustrated generally and schematically at 10, in FIG. 1, and will be described in detail with reference thereto. At the heart of the bi-dimensional substrate surface treatment system 10 is a gas reactor 12 employing a sealing roller assembly in accordance with the present invention. The gas reactor 12 is illustrated schematically, in cross-section, in FIG. 1. An exemplary embodiment of a gas reactor 12 in accordance with the present invention is illustrated in cross-section in more detail in FIG. 2.

Figure 2:
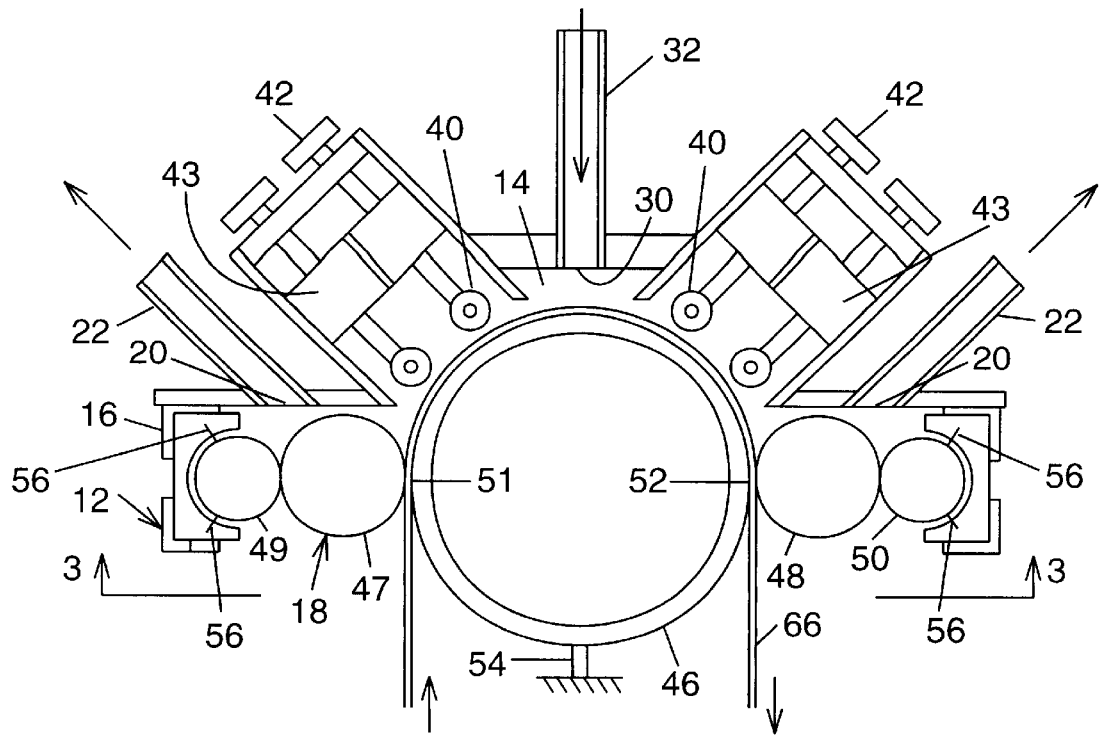
FIG. 2 is a more detailed cross-sectional view of an exemplary gas reactor employing a sealing roller assembly in accordance with the present invention.

A gas reactor 12 in accordance with the present invention will thus be described in detail with reference to both FIG. 1 and FIG. 2. A gas reactor 12 in accordance with the present invention includes a vacuum-sealed gas reaction chamber 14. The reaction chamber 14 is defined by a reactor housing 16, a sealing roller assembly 18, and end walls or faceplates (not shown in FIGS. 1 and 2). The reactor housing 16 and roller assembly 18 may be of any length, to thereby accommodate any width of continuous bi-dimensional substrate material for the surface treatment thereof within the reaction chamber 14. The reactor housing 16 may be formed as one piece, of a material such as stainless steel, or may be formed as multiple pieces, e.g., a top wall and side walls, wherein the pieces forming the reactor housing 16 are joined together either permanently or removeably in a sealed relation to prevent leakage of gas into or out of the reaction chamber 14 between the pieces which form the reactor housing 16.

One or more vacuum ports 20 are formed in the reactor housing 16. Gas evacuation lines 22, illustrated schematically in FIG. 1, connect the vacuum ports 20 in fluid communication with a vacuum pump 24. The vacuum pump 24, which may be conventional in design, may thus be used to evacuate the interior of the reaction chamber 14 via the vacuum ports 20 formed in the reactor housing 16. A trap 26 is preferably connected in series with the gas evacuation lines 22, between the reactor 12 and the vacuum pump 24, to trap liquid condensation, e.g., liquid nitrogen, evacuated from the reaction chamber 14, to thereby prevent the liquid from reaching the vacuum pump 24, which might be damaged thereby. A large capacity valve 28 may also be connected in series with the gas evacuation lines 22. The large capacity valve 28 may be operated, either manually, or by an automatic valve controller, to thereby control evacuation of the reaction chamber 14 by the vacuum pump 24.

The reactor housing 16 also has a gas inlet port 30 formed therein. The gas inlet port 30 is preferably connected in fluid communication with a reactive gas supply by a gas supply line 32, illustrated schematically in FIG. 1. The gas supply line 32 may be made of a material such as stainless steel. The gas supply line 32 connects the gas inlet port 30 to one or more containers 34 containing reactive gasses and/or monomers. The gas supply line 32 may also be connected to a gas-feed system 35 (e.g., argon, oxygen, etc.). The gas-feed system 35 may be employed both for creating complex gas-vapor mixtures within the reaction chamber 14, and for enhancing the evaporation of lower volatility liquid phase components. Needle valve systems 36 are connected on the gas supply line 32 between the gas containers 34 and gas feed system 35 and the reaction chamber 14. The valve systems 36, which may be implemented in a conventional manner, may be operated in a conventional manner, either manually, or using an automatic value control system, to admit a desired gas mixture into the reaction chamber 14 via the gas inlet port 30.

A pressure gauge 38, which may be implemented in a conventional manner, is preferably connected in fluid communication with either the gas supply line 32, or the gas evacuation line 22. The pressure gauge 38 provides an operator of the bi-dimensional substrate surface treatment system 10 within an indication of the gas pressure level within the reaction chamber 14. The pressure gauge 38 may simply provide a pressure reading which is observed by an operator of the system 10, or may provide a pressure signal, corresponding to the pressure level within the reaction chamber 14, to an automatic process control system.

One or more electrodes 40 are mounted to the reactor housing 16 within the reaction chamber 14. The electrodes 40 may be implemented in a conventional manner, such as using a metal filament encased in a dielectric material, e.g., ceramic. The electrodes 40 mounted in the reactor housing 16 are connected to high-voltage electrode leads 42 which extend through the reactor housing 16 out of the reaction chamber 14. The electrode leads 42 may be supported by a support structure 43 within the reaction chamber 14. The electrode leads 42 may be made movable in the reactor housing 16 and electrode supports 43 such that the position of the electrodes 40 within the reaction chamber 14 may be adjusted. Conventional sealing may be provided at the points where the high-voltage electrode leads 42 pass through the reactor housing 16. The electrode leads 42 connect the electrodes 40 to a conventional high-voltage power supply 44. The high-voltage power supply 44 is preferably capable of providing a high voltage signal across a range of frequencies to the electrodes 40. An exemplary high voltage power supply 44 is a conventional 10 Hz, 10,000 V, and 0–500 W range power supply.

Preferably, the vacuum ports 20, gas inlet port 30, and electrodes 40 are positioned with respect to each other within the reaction chamber 14 such that the electrodes 40 are positioned between the gas inlet port 30 and the vacuum ports 20. Thus, a reactive gas admitted into the reaction chamber 14 through the gas inlet port 30 will be drawn past the electrodes 40 before being evacuated from the reaction chamber through the vacuum ports 20. As will be described in more detail below, this arrangement insures that reactive-gases admitted into the reaction chamber 14 are forced to pass through a plasma curtain generated by the electrodes 40 before being evacuated from the reaction chamber 14.

The walls of the reactor housing 16 define an opening into the reaction chamber 14. It is through this opening that a bi-dimensional substrate to be treated is passed into the reaction chamber 14. The opening into the reaction chamber 14 is sealed by the sealing roller assembly 18, which is mounted between the walls of the reactor housing 16 in a sealed relation thereto.

A sealing roller assembly 18 in accordance with the present invention includes five rollers: a central roller 46, first and second inside sealing rollers 47 and 48, and first and second outside sealing rollers 49 and 50. The rollers 46–50 in the roller assembly 18 are preferably mounted with respect to each other along a straight line. In other words, the rollers 46–50 are preferably mounted with respect to each other such that the axes of the rollers 46–50 are parallel to each other and perpendicular to the same imaginary straight line. The inside sealing rollers 47 and 48 are mounted on each side of the central roller 46, to form first and second transport contact points 51 and 52 between the central roller 46 and the first and second inside sealing rollers 47 and 48, respectively. The first and second outside sealing rollers 49 and 50 are mounted in contact with the first and second inside sealing rollers 47 and 48, respectively, on sides of the inside sealing rollers 47 and 48 opposite the first and second transport contact points 51 and 52, respectively.

The central roller 46 is the substrate driving roller. A bi-dimensional substrate is carried into and out of the reaction chamber 14 on the surface of the central roller 46. The central roller 46 is preferably made of a conductive material, such as stainless steel, and is electrically grounded, e.g., by an electrical connection 54 to ground (schematically illustrated in FIGS. 1 and 2). The ground connection 54 to the central roller 46 may be implemented in a conventional manner, such as using a brush or roller electrical connection between ground and the roller surface. With the central roller 46 grounded, ions in a plasma generated in the reaction chamber 14 will be drawn toward the central roller 46, to thereby contact the surface of a bi-dimensional substrate material transported through the reaction chamber 14 on the central roller 46. The central roller 46 is preferably hollow. The central roller 46 may preferably be cooled, such as by running water through the hollow portion of the central roller 46 using, e.g., a rotating water coupling (not shown). The diameter of the central roller 46 is preferably larger than the diameters of the other rollers 47–49 in the roller assembly 18. Thus, when the roller assembly 18 is mounted on the reactor housing 16, the central roller 46 occupies a majority of the volume of the reaction chamber 14. This minimizes the active volume of the reaction chamber 14, assuring the handling of small volumes of reactive gases during plasma treatment, and facilitating the evacuation of plasma generated gas mixtures.

The inside sealing rollers 47 and 48 may also be made of stainless steel. The surfaces of the inside sealing rollers 47 and 48 are preferably covered with a compliant material, such as soft rubber. Thus, the inside sealing rollers 47 and 48 provide a good vacuum seal between the inside sealing rollers 47 and 48 and both the central roller 46 and the outside sealing rollers 49 and 50, while providing for non-slip transport of a bi-dimensional substrate material through the transport contact points 51 and 52.

The outside sealing rollers 49 and 50 may also be made of stainless steel, and have non-compliant roller surfaces. Vacuum sealing between the outside sealing rollers 49 and 50 and the reactor housing 16 is preferably achieved using thin sealing blades 56 of a non-compliant material, such as Teflon, which extend from the reactor housing and are pressed against the outside sealing roller surfaces along the length thereof. The sealing blades 56 may be replaceable.

(Note that the sealing blades 56 may be mounted in a roller assembly frame (not shown), in which the rollers 46–50 of the roller assembly are mounted, to create a seal between the outside sealing rollers 49 and 50 and the frame. The roller assembly frame may then be attached to the reactor housing 16 to close the opening into the reaction chamber 14.) The sealing blades 56 create a good low friction vacuum seal between the reactor housing 16 and the rotating outside sealing roller surfaces. The combination of inside sealing rollers 47 and 48, having compliant surfaces, and outside sealing rollers 49 and 50, having non-compliant surfaces, allows a roller assembly 18 in accordance with the present invention to provide proper control of the pressure exerted by the rollers on a bi-dimensional substrate transported into the reaction chamber 14 thereby, to prevent slipping of the substrate material, without creating serious friction problems at the surface interfaces between the roller assembly 18 and the reactor housing 16.

The reaction chamber 14 is closed at the ends thereof by end walls or face plates 58 attached at each end of the reactor housing 16. The end walls 58 are attached to the reactor housing such that a vacuum seal is created between the housing 16 and the end walls 58. This may be achieved in a conventional manner, using, e.g., a gasket seal between the reactor housing 16 and the end walls 58.

Figure 3:
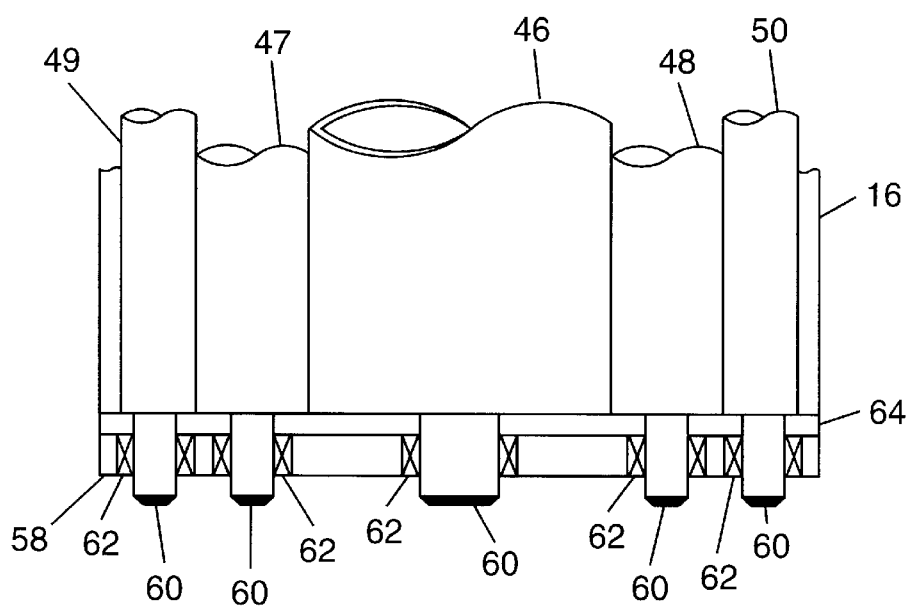
FIG. 3 is a bottom view taken generally along the line 3—3 of FIG. 2, in partial cross-section, of a portion of a sealing rolling assembly in accordance with the present invention, showing ends of the rollers in the sealing roller assembly mounted in an end wall or faceplate of the gas reactor.

A preferred method for achieving a vacuum seal between the ends of the rollers 46–50 in the roller assembly 18 and the end walls 58 is illustrated in, and will be described with reference to, FIG. 3. Each roller 46–50 in the roller assembly 18 has a roller axle 60 extending from each end thereof. Each roller axle 60 preferably has a smaller diameter than its corresponding roller 46–50. The roller axles 60 extend into or through the end wall 58. Conventional bearing assemblies 62 are mounted in or on the end wall 58 around each roller axle 60, to support the roller axles 60 for free rotation within the end wall 58. Conventional gear mechanisms (not shown in FIG. 3) may be connected to the roller axles 60 on an outside of the end wall 58 for driving synchronized rotation of the rollers 46–50 in the manner to be described below. A seal may be achieved between the ends of the rollers 46–50 in the roller assembly 18 and the end wall 58 by placing a sealing plate 64, of a hard material, such as Teflon, between the ends of the rollers and the end wall 58. The roller axles 60 are passed through apertures in the sealing plate 64. The end wall 58 is mounted to the reactor housing 16 so as to create sufficient compressive force between the sealing plate 64 and the ends of the rollers 46–50 in the roller assembly 18 to create a seal between the ends of the rollers 46–50 in the roller assembly and the sealing plate 64, without affecting rotation of the rollers 46–50. Note that in order for an effective seal to be created between each of the rollers 46–50 and the sealing plate 64, the rollers 46–50 in the roller assembly 18 preferably have as nearly as possible the exact same length. Note also that this method of sealing the ends of the rollers 46–50 in the roller assembly 18 requires non-compliant end roller surfaces. A ring of non-compliant material, e.g., Teflon, may be provided at each roller end for this purpose. A Teflon ring may be required particularly for the ends of the inside sealing rollers 47 and 48, which have compliant roller surfaces, to prevent high friction contact between the compliant roller surfaces and the end sealing plate 64.

The transportation of a bi-dimensional substrate material 66 through the reaction chamber 14 by a roller assembly 18 in accordance with the present invention will now be described in detail with reference to FIGS. 1 and 2. The substrate 66 is transported into the reaction chamber 14 by rotation of the rollers 46–50 in the roller assembly 18. Rotation of the rollers 46–50 in the roller assembly 18 is preferably controlled by an electrical motor 68. The motor 68 may be connected to the rollers 46–50 in a conventional manner, e.g., using appropriate gear connections, to drive each of the rollers 46–50 in the roller assembly 18 in a synchronized manner. Synchronized rotation of all of the sealing rollers 46–50 in the roller assembly 18 ensures that undesired tension buildup in the substrate material 66 is avoided and slipping of the substrate material 66 on the roller surfaces is eliminated. In this manner, scratching of bi-dimensional substrate films or fabrics by the roller assembly 18 during plasma surface treatment processing is substantially reduced. The speed at which a bi-dimensional substrate 66 is transported through the reaction chamber 14 depends upon the surface treatment process employed. Substrate speed may be controlled by controlling the speed of the electric motor 68 using, e.g., a motor controller 70. Motor controller 70 may be implemented in a conventional manner to allow manual or automatic control of substrate speed.

The bi-dimensional substrate 66 to be treated may be provided on a supply roll 72. The substrate 66 is passed from the supply roll 72 through the first transport contact point 51 between the central roller 46 and the first inside sealing roller 47 into the reaction chamber 14. The substrate 66 is carried through the reaction chamber 14 on the surface of the central roller 46. The substrate 66 is passed out of the reaction chamber 14 through the second transport contact point 52 formed between the central roller 46 and the second inside sealing roller 48. Treated substrate material emerging from the reaction chamber 14 may be rolled onto a take up roll 74. Proper tensioning of the substrate 66 may be achieved in a conventional manner using, e.g., an electronically controlled brake 76 attached to the substrate supply roll 72 and controlled by a brake controller 78, in combination with an air motor 80 connected to the substrate take up roll 72.

A gas reactor employing a sealing roller system in accordance with the present invention may be used for the surface treatment of any bi-dimensional substrate using a variety of known plasma treatment materials and processes. Surface treatment is achieved by evacuating the reaction chamber 14 (e.g., via vacuum ports 20), admitting a reactive gas (if desired) into the reaction chamber 14 (e.g., via gas inlet port 30), applying a high voltage electrical current signal to the electrodes 40 to generate a plasma in the reaction chamber 14, and transporting the bi-dimensional substrate 66 through the reaction chamber 14 in the manner described to achieve the desired surface treatment result.

As an example only of one possible application of a gas reactor employing a sealing roller system in accordance with the present invention, an industrial polypropylene film was treated by corona discharge employing a bi-dimensional substrate surface treatment system in accordance with the present invention. For this exemplary experimental surface treatment process, the pressure in the reaction chamber 14 was reduced to 600 Torr. A mixture of $SiCl_4$ vapors and $O_2$ was admitted into the reaction chamber 14 via the gas inlet port 30. Evaporation of the $SiCl_4$ was enhanced by passing oxygen through the liquid phase compound. The flow rate of oxygen was 2.5 sccm. Three hundred watts of power were dissipated into the electrodes 40 to generate a corona discharge plasma within the reaction chamber 14. An industrial polypropylene film, 0.68 mils thick and 45 centimeters wide, was passed into the reaction chamber 14 via the roller assembly 18, in the manner described previously, at a rate of 6 meters per minute. X-ray photoelectron spectroscopy (ESCA) analysis of the treated substrate material indicated the following surface atomic composition of the polypropylene as a result of the corona treatment: oxygen 18%, silicon 4%, and carbon 78%. The water-based contact angle of the plasma treated polypropylene was 68°, compared to a contact angle of 97° for untreated polypropylene.

It is understood that the present invention is not limited to the applications and embodiments illustrated and described herein, but embraces such modified forms thereof as come within the scope of the following claims.

What is claimed is:

1. A gas reactor for the plasma surface treatment of a continuous bi-dimensional substrate, comprising:
   (a) a reactor housing defining a reaction chamber on an interior thereof and an opening into the reaction chamber; and
   (b) a roller assembly including:
      (i) a central roller having a central roller surface and central roller ends;
      (ii) a first inside sealing roller having a first inside sealing roller surface and first inside sealing roller ends and positioned adjacent to the central roller surface such that the first inside sealing roller surface is parallel to the central roller surface and forms a first transport contact point between the first inside sealing roller surface and the central roller surface;
      (iii) a second inside sealing roller having a second inside sealing roller surface and second inside sealing roller ends and positioned adjacent to the central roller surface such that the second inside sealing roller surface is parallel to the central roller surface and forms a second transport contact point between the second inside sealing roller surface and the central roller surface;
      (iv) a first outside sealing roller having a first outside sealing roller surface and first outside sealing roller ends and positioned adjacent to the first inside sealing roller surface such that the first outside sealing roller surface is parallel to the first inside sealing roller surface to create a seal between the first outside sealing roller surface and the first inside sealing roller surface;
      (v) a second outside sealing roller having a second outside sealing roller surface and second outside sealing roller ends and positioned adjacent to the second inside sealing roller surface such that the second outside sealing roller surface is parallel to the second inside sealing roller surface to create a seal between the second outside sealing roller surface and the second inside sealing roller surface;
         wherein the roller assembly is attached in a sealed relation to the reactor housing to seal the opening in the reactor housing.

2. The gas reactor of claim 1 comprising additionally at least one vacuum port formed in the reactor housing, a gas inlet port formed in the reactor housing, and an electrode mounted in the reaction chamber between the gas inlet port and the vacuum port such that a gas admitted into the reaction chamber through the gas inlet port passes through a plasma generated by the electrode before being evacuated from the reaction chamber through the vacuum port.

3. The gas reactor of claim 1 wherein the central roller surface is made of a non-compliant material.

4. The gas reactor of claim 3 wherein the central roller is made of stainless steel.

5. The gas reactor of claim 1 comprising additionally means for connecting the central roller surface to ground.

6. The gas reactor of claim 1 wherein the first and second inside sealing roller surfaces are made of a compliant material.

7. The gas reactor of claim 6 wherein the first and second inside sealing roller surfaces are made of soft rubber.

8. The gas reactor of claim 1 wherein the first and second outside sealing roller surfaces are made of a non-compliant material.

9. The gas reactor of claim 8 wherein the first and second outside sealing rollers are made of stainless steel.

10. The gas reactor of claim 1 comprising additionally a sealing blade mounted in a fixed relation to the reactor housing against each of the first and second outside sealing roller surfaces to create a seal between the sealing blades and the first and second outside sealing roller surfaces.

11. The gas reactor of claim 10 wherein the sealing blades are made of Teflon.

12. The gas reactor of claim 1 comprising additionally a sealing plate mounted in a fixed relation to the reactor housing against each end of the central roller, the first and second inside sealing rollers, and the first and second outside sealing rollers to create a seal between the ends of the central roller, the first and second inside sealing rollers, and the first and second outside sealing rollers and the sealing plate.

13. The gas reactor of claim 12 wherein the sealing plate is made of Teflon.

14. The gas reactor of claim 12 wherein the sealing plate is pressed against the ends of the central roller, the first and second inside sealing rollers, and the first and second outside sealing rollers by an end wall attached to the reactor housing, such that sufficient compressive force is provided between the sealing plate and the ends of the central roller, the first and second inside sealing rollers, and the first and second outside sealing rollers to create a seal between the ends of the central roller, the first and second inside sealing rollers, and the first and second outside sealing rollers and the sealing plate without preventing rotation of the central roller, the first and second inside sealing rollers and the first and second outside sealing rollers.

15. A gas reactor for the plasma surface treatment of a continuous bi-dimensional substrate, comprising:
   (a) a reactor housing defining a reaction chamber on an interior thereof and an opening into the reaction chamber;
   (b) a roller assembly attached in a sealed relation to the reactor housing to seal the opening in the reactor housing, including:
      (i) a central roller having a central roller surface and central roller ends;
      (ii) a first inside sealing roller having a compliant first inside sealing roller surface and first inside sealing roller ends and positioned adjacent to the central roller surface such that the first inside sealing roller surface is parallel to the central roller surface and forms a first transport contact point between the first inside sealing roller surface and the central roller surface;
      (iii) a second inside sealing roller having a compliant second inside sealing roller surface and second inside sealing roller ends and positioned adjacent to the central roller surface such that the second inside sealing roller surface is parallel to the central roller surface and forms a second transport contact point between the second inside sealing roller surface and the central roller surface;
      (iv) a first outside sealing roller having a non-compliant first outside sealing roller surface and first outside sealing roller ends and positioned adjacent to the first inside sealing roller surface such that the first outside sealing roller surface is parallel to the first inside sealing roller surface to create a seal between the first outside sealing roller surface and the first inside sealing roller surface;

(v) a second outside sealing roller having a second non-compliant outside sealing roller surface and second outside sealing roller ends and positioned adjacent to the second inside sealing roller surface such that the second outside sealing roller surface is parallel to the second inside sealing roller surface to create a seal between the second outside sealing roller surface and the second inside sealing roller surface;

(c) a sealing blade mounted in a fixed relation to the reactor housing against each of the first and second non-compliant outside sealing roller surfaces to create a seal between the sealing blades and the first and second non-compliant outside sealing roller surfaces; and (d) a sealing plate mounted in a fixed relation to the reactor housing against each end of the central roller, the first and second inside sealing rollers, and the first and second outside sealing rollers to create a seal between the ends of the central roller, the first and second inside sealing rollers, and the first and second outside sealing rollers and the sealing plate.

16. The gas reactor of claim 15 comprising additionally at least one vacuum port formed in the reactor housing, a gas inlet port formed in the reactor housing, and an electrode mounted in the reaction chamber between the gas inlet port and the vacuum port such that a gas admitted into the reaction chamber through the gas inlet port passes through a plasma generated by the electrode before being evacuated from the reaction chamber through the vacuum port.

17. The gas reactor of claim 15 wherein the central roller surface is made of a non-compliant material.

18. The gas reactor of claim 17 wherein the central roller is made of stainless steel.

19. The gas reactor of claim 15 comprising additionally means for connecting the central roller surface to ground.

20. The gas reactor of claim 15 wherein the first and second inside sealing roller surfaces are made of soft rubber.

21. The gas reactor of claim 15 wherein the first and second outside sealing rollers are made of stainless steel.

22. The gas reactor of claim 15 wherein the sealing blades are made of Teflon.

23. The gas reactor of claim 15 wherein the sealing plate is made of Teflon.

24. The gas reactor of claim 12 wherein the sealing plate is pressed against the ends of the central roller, the first and second inside sealing rollers, and the first and second outside sealing rollers by an end wall attached to the reactor housing, such that sufficient compressive force is provided between the sealing plate and the ends of the central roller, the first and second inside sealing rollers, and the first and second outside sealing rollers to create a seal between the ends of the central roller, the first and second inside sealing rollers, and the first and second outside sealing rollers and the sealing plate without preventing rotation of the central roller, the first and second inside sealing rollers and the first and second outside sealing rollers.

25. A gas reactor for the plasma surface treatment of a continuous bi-dimensional substrate, comprising:

(a) a reactor housing defining a reaction chamber on an interior thereof and an opening into the reaction chamber;

(b) a roller assembly attached in a sealed relation to the reactor housing to seal the opening in the reactor housing and including a central roller having a grounded central roller surface extending into the reaction chamber;

(c) at least one vacuum port formed in the reactor housing;

(d) a gas inlet port formed in the reactor housing; and (e) an electrode mounted in the reaction chamber adjacent to but not in contact with the grounded central roller surface and positioned between the gas inlet port and the vacuum port such that a gas admitted into the reaction chamber through the gas inlet port passes through a plasma generated between the electrode and the grounded central roller surface before being evacuated from the reaction chamber through the vacuum port.

* * * * *